United States Patent [19]

Spitz et al.

[11] Patent Number: 4,960,731
[45] Date of Patent: Oct. 2, 1990

[54] METHOD OF MAKING A POWER DIODE WITH HIGH REVERSE VOLTAGE RATING

[75] Inventors: Richard Spitz; Vesna Biallas, both of Reutlingen, Fed. Rep. of Germany

[73] Assignee: Robert Bosch GmbH, Stuttgart, Fed. Rep. of Germany

[21] Appl. No.: 344,295

[22] Filed: Apr. 27, 1989

[30] Foreign Application Priority Data

May 7, 1988 [DE] Fed. Rep. of Germany ....... 3815615

[51] Int. Cl.⁵ .............................................. H01L 21/22
[52] U.S. Cl. ..................................... 437/152; 457/12; 457/248; 457/953; 457/904
[58] Field of Search ................... 437/152, 248, 12, 953

[56] References Cited

U.S. PATENT DOCUMENTS

| | | | |
|---|---|---|---|
| 2,802,760 | 8/1957 | Derick et al. | 437/152 |
| 2,804,405 | 8/1957 | Derick et al. | 437/152 |
| 3,814,639 | 6/1974 | Dumas | 437/152 |
| 3,867,203 | 2/1975 | Gesing et al. | 437/152 |
| 3,914,138 | 10/1975 | Rai-Choudhury | 437/152 |
| 4,376,657 | 3/1983 | Nagasawa et al. | 437/248 |
| 4,415,916 | 11/1983 | Protic et al. | |

Primary Examiner—Brian E. Hearn
Assistant Examiner—C. Chaudhari
Attorney, Agent, or Firm—Frishauf, Holtz, Goodman & Woodward

[57] ABSTRACT

In making a power diode with high reverse voltage rating, corrosion of the silicon wafer surface by gettering substances is avoided by employing two different diffusion steps. In the first step, boron and phosphorus are respectively applied to opposing major surfaces of the disk-shaped semiconductor body (10) and driven into it by heating to a predetermined temperature. Gettering is employed to increase the charge carrier lifetime and thereby reduce the forward voltage drop of the diode. The gettering is carried out in a second diffusion step at a diffusion temperature sufficiently reduced with respect to the diffusion temperature of the first step to avoid significantly affecting the depth of diffusion of the doping substances into the semiconductor body.

16 Claims, 2 Drawing Sheets

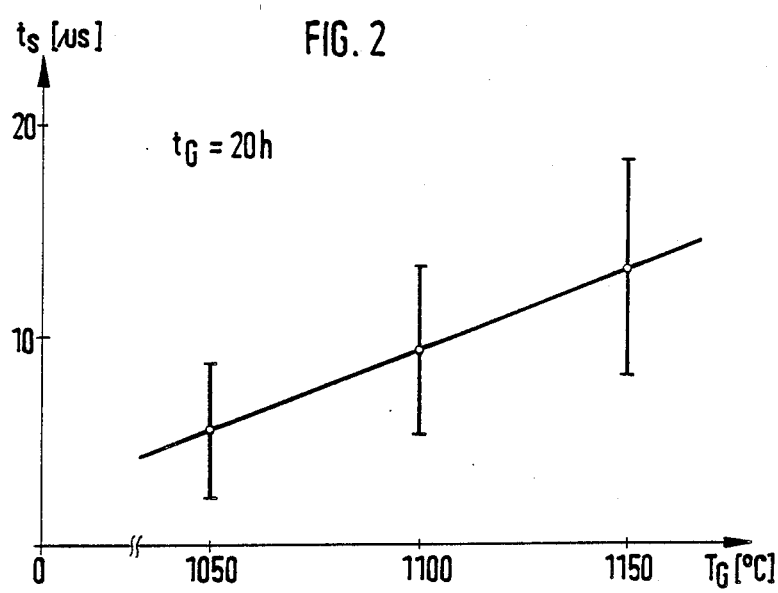
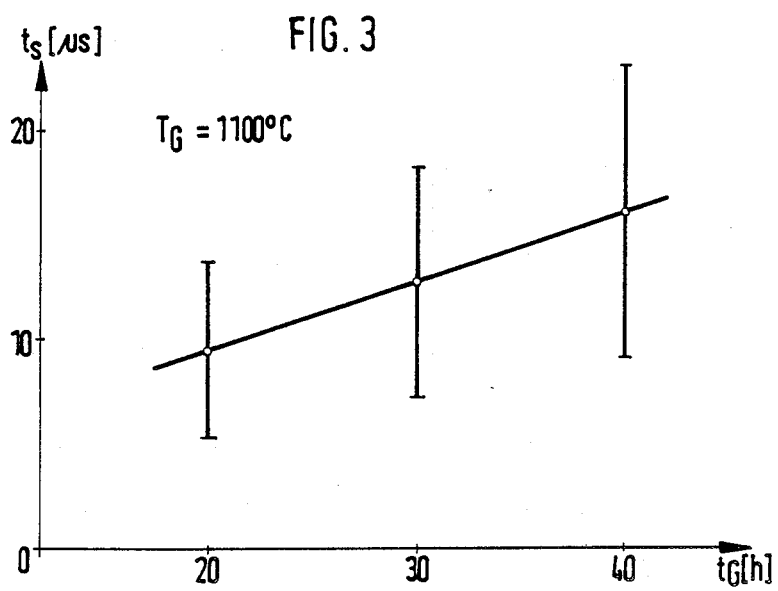

METHOD OF MAKING A POWER DIODE WITH HIGH REVERSE VOLTAGE RATING

Cross-reference to related U.S. Patent(s), the disclosure(s) of which is/are hereby incorporated by reference: U.S. Pat. No. 4,415,916, PROTIC et al., Nov. 15, 1983.

The present invention relates generally to semiconductor device manufacturing methods, and, more particularly, to a method of making a power diode which can tolerate high reverse voltage.

BACKGROUND

There is a known manufacturing method in which the gettering is carried out by diffusing into the semiconductor, along with boron and phosphorus, gettering substances such as nickel chloride This is intended to increase the lifetime of the charge carriers This method, however, has the disadvantage that the surface of the semiconductor body becomes corroded by gettering substances which are intermixed with the diffusion substances. This corrosion is unfavorable for subsequent manufacturing steps. A further disadvantage is that the lifetime of the charge carriers cannot be increased independently of the diffusion depth.

THE INVENTION

It is an object of the present invention to provide gettering without using supplemental gettering substances and to thereby avoid corroding the surface of the semiconductor body. Another important object is to increase the lifetime of the charge carriers independently of the diffusion depth. Yet another object is to minimize forward voltage drop.

Briefly, in a first step, boron and phosphorus are each diffused into a different major surface of the semiconductor body, preferably at about 1265° C. over a period of 30 hours, but no supplemental gettering substances are used. In a second step, carried out at between 1050° C. and 1150° C., gettering is done over a period of about 30 hours. The second step does not significantly affect diffusion depth.

DRAWINGS

FIG. 2 is a graph illustrating the dependence of charge carrier lifetime $t_s$ in microseconds on gettering diffusion temperature $T_G$ in degrees Celsius;

FIG. 3 is a graph illustrating the dependence of charge carrier lifetime in microseconds on gettering diffusion time $t_G$ in hours.

DETAILED DESCRIPTION

Figure 1:
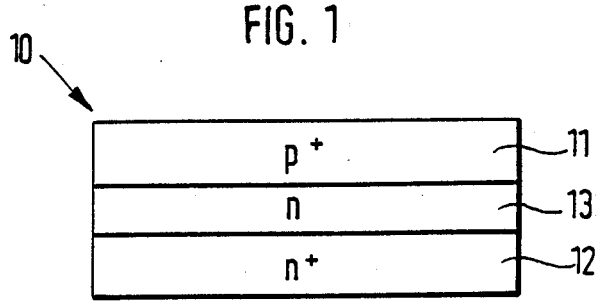
FIG. 1 illustrates schematically a semiconductor body with three layers composed respectively of p+ type semiconductor, n type semiconductor, and n+ type semiconductor.

The method of the present invention is capable of making high-rated power diodes with a breakdown voltage $U_R$ of preferably more than 100 volts. One begins with a disk-shaped semiconductor body 10 of silicon, preferably about 200 micrometers thick, and having a doping of phosphorus, preferably less than about $10^{16}$ atoms/cm$^3$. In a first diffusion step, one diffuses boron into the semiconductor body from one side and phosphorus into the semiconductor body from the other side, resulting in a p+nn+ structure with a p+ diffused zone 11, an n+ diffused zone 12, and a middle n zone 13, in which the original n-doping of less than $10^{16}$ atoms/cm$^3$ is maintained. For application of the doping substances, one preferably places doping foils on the semiconductor body 10 or applies doping solutions to it, e.g. under centrifugal pressure.

Suitable conditions for the first diffusion step are a diffusion temperature of about 1265° C. and a diffusion time of about 30 hours in an oxidizing atmosphere. These conditions result, after the first diffusion step, in a diffusion depth of about 70 micrometers and a surface concentration of doping substances of about $10^{20}$ atoms/cm$^3$.

The minimum thickness of the n-doped regions 13 is a function of the breakdown voltage which is intended. Since, for each 100 volts of breakdown voltage, a middle zone thickness component of about 10 micrometers must be provided, a breakdown voltage of $U_R=600$ volts requires at least 60 micrometers for the thickness of middle zone 13.

In order to achieve as low as possible a forward voltage drop at high current densities (greater than or equal to 500 amps/cm$^2$), the charge carrier lifetime must not go below a minimum value which is dependent upon the thickness of middle zone 13.

In order to lower the forward voltage drop, the present invention proposes that, after the first diffusion step in which the doping substances are driven into the semiconductor body 10 to the desired diffusion depth, the diffusion temperature is lowered in a second diffusion step over a predetermined period of time to a lower value which does not significantly influence the diffusion depth. This produces a gettering effect, in the semiconductor body, which increases the lifetime of the charge carriers, thereby lowering the forward voltage drop of the diode.

The second diffusion step is carried out at a diffusion temperature between 1050° and 1150° C., preferably about 1100° C. At a diffusion temperature of 1100° C., this second diffusion step can take about 30 hours. As with the first diffusion step, this one is performed in an oxidizing atmosphere.

FIG. 2 illustrates, for a getter diffusion time of $t_G=20$ hours, the dependence of charge carrier lifetime on the gettering diffusion temperature $T_G$.

FIG. 3 illustrates, for a gettering diffusion temperature of $T_G=1100°$ C., the dependence of the charge carrier lifetime on the gettering diffusion time $t_G$. As the unit of measure in FIGS. 2 and 3 for the charge carrier lifetime, the memory time $t_s$ in microseconds is used; this is measured upon switching of the diode from a forward current of 10 milliamperes (mA) to a reverse current of 10 mA.

As one can see from FIGS. 2 and 3, when either of the getter diffusion temperature $T_G$ and the getter diffusion time $t_G$ has a specified value, the charge carrier lifetime scatters over a particular range, but it is also apparent that the charge carrier lifetime increases both as getter diffusion temperature increases and as getter diffusion time increases. Thus, charge carrier lifetime can be increased either by increasing getter diffusion temperature or by increasing getter diffusion time. The getter diffusion temperature should, however, not be reduced below 1050° C. because otherwise gettering performance will be too feeble. On the other hand, getter diffusion temperature should preferably not exceed 1150° C. because at higher values the diffusion depth is markedly affected.

Figure 4:
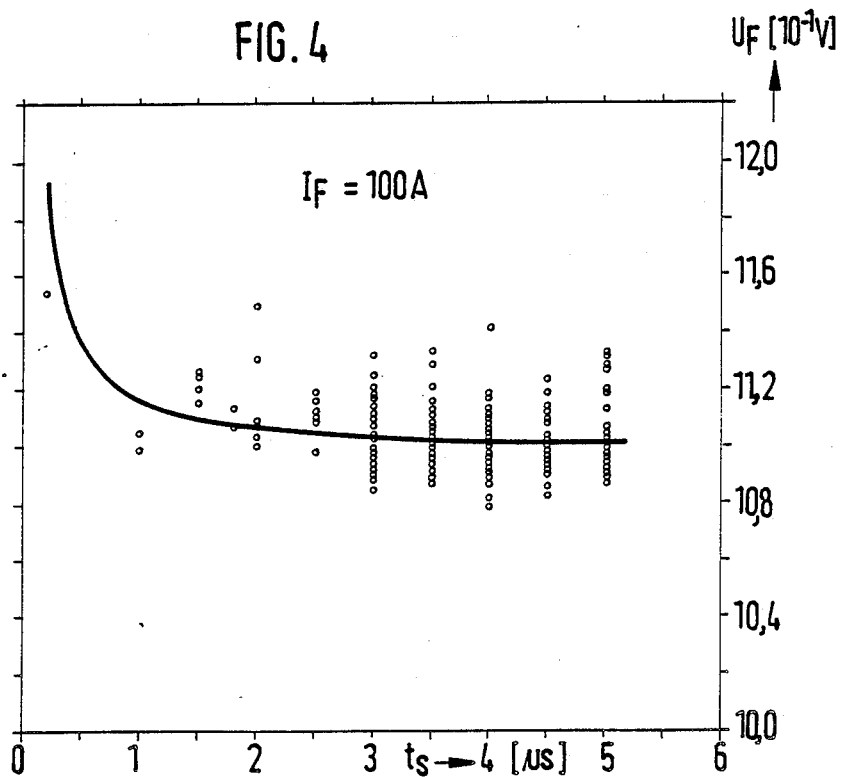
FIG. 4 is a graph illustrating the dependence of forward voltage drop $U_F$ on charge carrier lifetime $t_s$ in microseconds for a p+nn+ structure as shown in FIG. 1.

FIG. 4 illustrates the relationship between forward voltage drop $U_F$ in multiples of one-tenth volt ($10^{-1}$ V) and memory time $t_s$ in microseconds for the p+nn+ structure of FIG. 1. Forward voltage drop $U_F$ is given for a forward current $I_F$ of 100 amperes (A). FIG. 4 reveals that, as charge carrier lifetime $t_s$ drops, the forward voltage drop grows only slightly at first, but rises steeply at values of memory time $t_s$ below 2 microseconds. For memory time $t_s$, one should therefore not go below 2 microseconds.

Various modifications are possible within the scope of the inventive concept.

We claim:

1. Method of making a high-reverse-voltage-rated power diode from a disk-shaped monocrystalline semiconductor body (10) having two major surfaces, onto each of which is applied respectively as a doping substance one of boron and phosphorus, after which, in a first diffusion step, said doping substances are driven into said semiconductor body (10) to a predetermined diffusion depth by heating said semiconductor body to a predetermined temperature,
   wherein, to lower the forward voltage drop of the diode, the lifetime of the charge carriers is increased by gettering,
   said gettering being carried out in a first diffusion step and a second diffusion step following said first diffusion step;
   said second diffusion step being carried out at a temperature sufficiently reduced, with respect to the temperature of said first diffusion step, to avoid significantly influencing depth of diffusion of said doping substances into said semiconductor body.

2. Method according to claim 1, wherein
said second diffusion step is carried out at a temperature between about 1050° C. and about 1150° C.

3. Method according to claim 2, wherein
said second diffusion step is carried out at a temperature of about 1100° C.

4. Method according to claim 3, wherein
said second diffusion step is carried out over a period of about 30 hours.

5. Method according to claim 1, wherein
said first diffusion step is carried out at a temperature of about 1265° C. and over a period of about 30 hours.

6. Method according to claim 2, wherein
said first diffusion step is carried out at a temperature of about 1265° C. and over a period of about 30 hours.

7. Method according to claim 3, wherein
said first diffusion step is carried out at a temperature of about 1265° C. and over a period of about 30 hours.

8. Method according to claim 4, wherein
said first diffusion step is carried out at a temperature of about 1265° C. and over a period of about 30 hours.

9. Method according to claim 1, wherein
said first and second diffusion steps are carried out in an oxidizing atmosphere.

10. Method according to claim 2, wherein
said first and second diffusion steps are carried out in an oxidizing atmosphere.

11. Method according to claim 3, wherein
said first and second diffusion steps are carried out in an oxidizing atmosphere.

12. Method according to claim 4, wherein
said first and second diffusion steps are carried out in an oxidizing atmosphere.

13. Method according to claim 5, wherein
said first and second diffusion steps are carried out in an oxidizing atmosphere.

14. Method according to claim 6, wherein
said first and second diffusion steps are carried out in an oxidizing atmosphere.

15. Method according to claim 7, wherein
said first and second diffusion steps are carried out in an oxidizing atmosphere.

16. Method according to claim 8, wherein
said first and second diffusion steps are carried out in an oxidizing atmosphere.

* * * * *